United States Patent [19]

McFarland et al.

[11] Patent Number: 5,799,049
[45] Date of Patent: Aug. 25, 1998

[54] PHASE-INDEPENDENT CLOCK CIRCUIT AND METHOD

[75] Inventors: Duncan A. McFarland, Tempe; Darrin R. Benzer, Chandler, both of Ariz.

[73] Assignee: Motorola, Inc., Schaumburg, Ill.

[21] Appl. No.: 626,593

[22] Filed: Apr. 2, 1996

[51] Int. Cl.$^6$ .................................................. H03D 13/00
[52] U.S. Cl. ............................................. 375/362; 375/371
[58] Field of Search .......................... 359/158; 370/503, 370/516, 517, 518; 375/362, 371–376

[56] References Cited

U.S. PATENT DOCUMENTS 5,511,100   4/1996   Lundberg et al. ..................... 375/375

*Primary Examiner*—Melvin Marcelo
*Attorney, Agent, or Firm*—Robert F. Hightower; Robert D. Atkins; Gary Hoshizaki

[57] ABSTRACT

A circuit and method are provided for generating a programmable clock signal VRCLK at a frequency of a reference signal VREF such that the phase of VRCLK in relation to the phase of VREF is variable. VREF and VRCLK are each coupled to a frequency comparing circuit which computes their respective frequencies. The frequency comparing circuit subtracts the respective frequencies of VREF and VRCLK to produce a frequency adjusting signal VFREQ which corresponds to the difference in the frequencies of VREF and VRCLK. VFREQ is used to adjust the frequency of VRCLK.

15 Claims, 2 Drawing Sheets

PHASE-INDEPENDENT CLOCK CIRCUIT AND METHOD

BACKGROUND OF THE INVENTION

This invention relates, in general, to high speed digital communication, and more particularly to synchronizing receiver clocks to transmitted data signals.

Fibre channel is an integrated system of specifications for high speed network communication. Communications between network nodes are based on protocol and hardware standards designed for synchronous high speed data transfers at a fixed rate of 1.0625 gigabits per second. Data is transmitted serially on two conductor lines using differential signals which simultaneously contain both data and system clock information.

A fibre channel network has no system master clock as such. Instead, each node has its own oscillator which produces a transmitting clock signal for timing its data transmissions. The localized oscillators are generally crystal controlled and tuned to a frequency which accommodates the specified 1.0625 gigabits per second data transmission rate. Even though the various transmitting clock signals are close to each other in frequency they are not precisely equal. Moreover, the transmitting clock signals are independent of each other with respect to phase. Each receiver must therefore synchronize its receiving clock with the transmitted data signals.

Synchronization to incoming data is especially important when data transfers are occurring at high data rates. As shown in FIG. 1, if a data signal is sampled while it is making a logic level transition there is a high probability of a data error. The optimum time for capturing the data signals is therefore in the middle of the bit cycle when the data signal is most stable.

The fibre channel specification does not provide for separate data and clock lines. Instead, the system clock is revealed to the receiver through data logic state transitions built into the fibre channel data transmission protocol. As these transitions are detected, phase information is detected by the receiver for adjusting the receiving clock to synchronize to the data signals. If the frequencies of the receiving clock and data signals are far apart, a large phase adjustment is needed which produces phase jitter in the receiving clock and results in data loss. It is therefore desirable for the receiving clock to have a frequency approximately equal to that of the data signals.

Known methods for equalizing the frequencies of a clock signal and a reference signal, such as using a phase locked loop, rely on controlling the phase of the clock signal to adjust its frequency. These methods produce fixed phase relationships between the clock and reference signals and therefore are not adequate for synchronizing to data signals in a fibre channel network.

What is needed is a method for adjusting the frequency of a receiving clock signal to be approximately the same as that of a transmitted data signal whereby phase adjustments can be made independent of the frequency in order to synchronize the receiving clock signal to incoming data bits. It would be a benefit if the phase adjustments were small so that phase jitter was reduced and synchronization could be completed before the transmitted data was lost.

DETAILED DESCRIPTION OF THE DRAWINGS

Fibre channel is a high speed communications architecture developed to provide efficient high speed communication between network nodes. Serial data is transmitted synchronously at a fixed bit rate of 1.0625 gigabits per second. The specified bit rate has a range of plus or minus 100 parts per million. Data signals are transmitted differentially and are carried on two conductors which can be shielded twinaxial cable. An encoded ten bit data word is used to transmit each eight bits of actual data in order to provide a balanced data signal having no direct current component and to guarantee logic level transitions for synchronizing the receiver.

The fibre channel specification does not provide for separate data and clock lines. Clock information is encoded in the ten bit data word in a way that guarantees at least one logic level transition for each five bits of transmitted signals. The transitions are detected by the receiver and used to produce phase adjustments in the receiving clock for synchronizing to the transmitted data. The receiver continuously monitors these logic level transitions and evaluates the captured data in order to detect at what point in the bit cycle the data is being sampled. When the sampling point drifts too far from the midpoint of the bit cycle, the phase of the receiving clock is shifted so that data is always sampled at time when it is stable.

Figure 1:
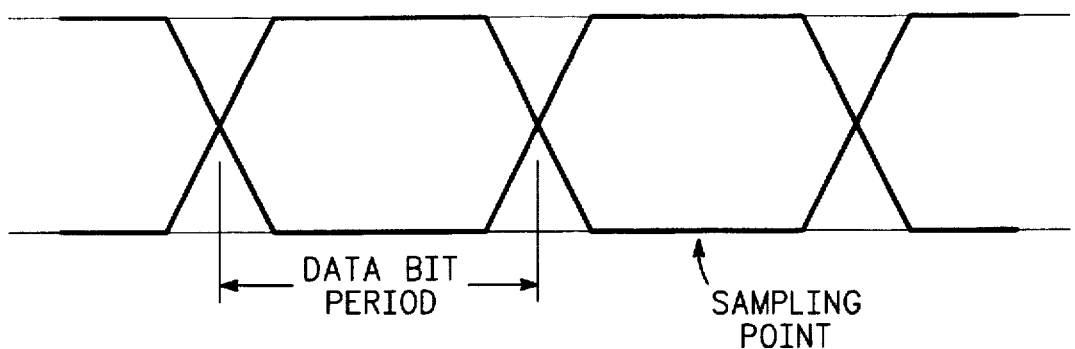
FIG. 1 is a timing diagram of high speed transmitted data bits and the optimum point for sampling or capturing a logic level thereof.

FIG. 1 is a timing diagram 10 of high speed transmitted data bits showing the optimum point for sampling or capturing a logic level thereof.

Because a fibre channel network has no system clock, each node provides its own reference clock signal which is used for data transmission timing when that node is transmitting on the network. The reference clock signal is typically provided by a crystal controlled oscillator circuit which is tuned to 106.25 megahertz, or one-tenth of the specified 1.0625 gigabits per second data rate. The tolerance of the frequency of the reference clock signal is plus or minus 100 parts per million. A phase shifting circuit is used for generating, in this case, ten equally phased bit clocks synchronized to the reference signal. The bit clocks provide the timing intervals for transmitting the ten data bits during each period of the reference clock signal.

Even though the distributed reference clocks are crystal controlled and approximately equal to each other in frequency, the transmitting and receiving clock signals are not synchronized to each other with respect to either phase or frequency. Therefore, a receiver cannot synchronize to the transmitted data signals with its own local reference clock signal. Instead it must provide a separate receiving clock signal which can be adjusted for synchronizing with the incoming data.

That is not to say the reference clock signal has no function when a network node is in the receiving mode. If large phase adjustments are made to the receiving clock signal, phase jitter is introduced in the receiving clock signal. This results in losing a portion of the data or, if severe enough, destabilizes the receiving clock signal to a point where it is never able to find a phase which synchronizes with the data signals. Such phase jitter and synchronization failures are expected when the receiving clock signal has a frequency far from that of the data signals. In this context, the frequency of the receiving clock signal is far from the frequency of the data signals when the resulting phase jitter is severe enough to result in data loss. Such frequency equalization is critical. Excess phase jitter has been observed even when the frequency of the receiving clock signal is within one percent of the frequency of the data signals.

In order to minimize phase jitter and synchronization time, the receiving clock signal is first locked to the reference frequency because its frequency is approximately that of the data signal. In this context, the receiving clock frequency being approximately equal to the reference frequency means that only a small frequency or phase adjustment is needed for synchronizing to and capturing the incoming data such that synchronization occurs before data is lost. After that, the phase is detected every clock cycle and is maintained with regular phase adjustments when needed to ensure that data is sampled at an optimum time in the middle of the bit cycle.

Figure 2:
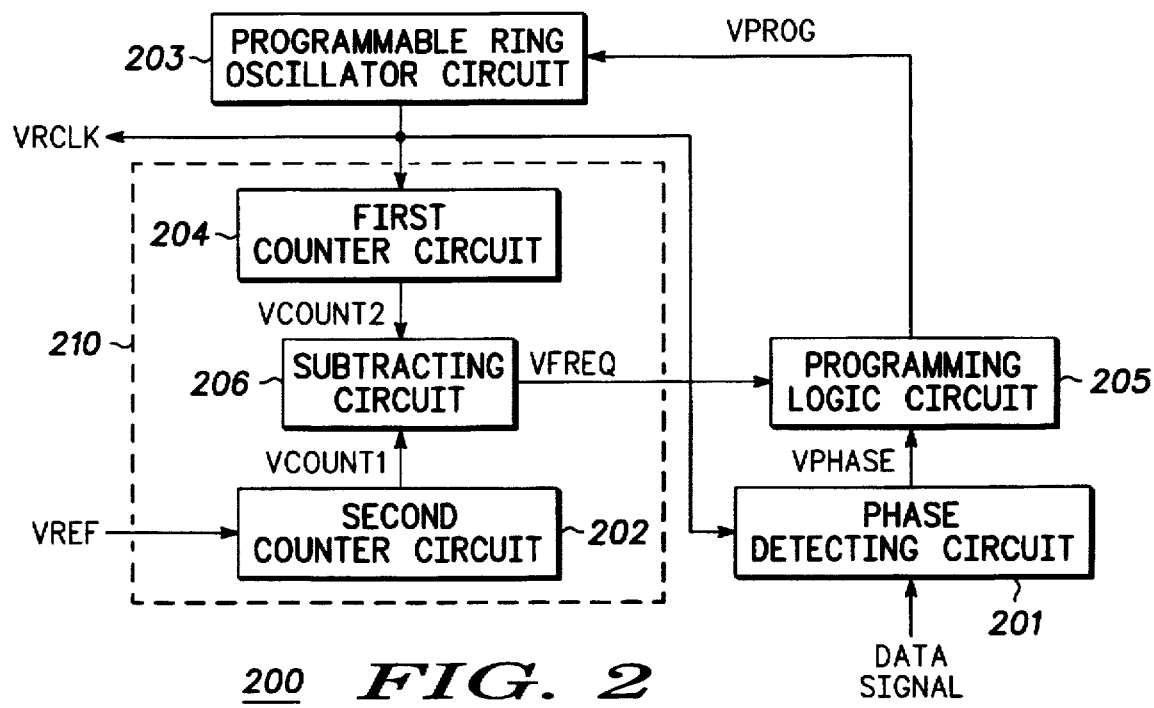
FIG. 2 is a block diagram of a receiver clock circuit for synchronizing to transmitted data signals in accordance with the present invention.

FIG. 2 is a block diagram of a receiver clock circuit 200 for producing a clock signal VRCLK for synchronizing to transmitted data signals. A reference signal VREF provides reference pulses at a fixed frequency of 106.25 megahertz. VREF is generally produced by a crystal controlled oscillator circuit (not shown) in the receiver. The frequency tolerance of VREF is plus or minus 100 parts per million. A programmable ring oscillator circuit 203 produces the receiving clock signal VRCLK. Each stage of the programmable ring oscillator circuit 203 has a programmable delay associated with it which varies according to a programming signal VPROG produced by a programming logic circuit 205. In effect, the signal VPROG causes delay to be added to or subtracted from the period of the signal VRCLK. If a particular adjustment to the period of VRCLK affects more than one cycle of VRCLK it is effectively a frequency adjustment of VRCLK. If it affects only one period of VRCLK it is essentially a phase adjustment. Therefore, both the phase and frequency of VRCLK are controlled in the same way by programming the delay of VRCLK. Either the phase or the frequency is adjustable independent of the other, the adjustments being distinguished only by the duration of a change in the programming signal VPROG.

The programming logic circuit 205 produces the programming signal VPROG in response to a frequency adjust signal VFREQ and a phase adjust signal VPHASE. VPHASE is generated by a phase detecting circuit 201 which analyzes the phase of VRCLK in relation to the phase of the incoming data signals to determine whether a phase adjustment is required. A variety of circuits which provide such a VPHASE signal corresponding to a phase difference between a data signal and a VRCLK signal are known to those skilled in the art. If a phase adjustment is needed for VRCLK to synchronize to the data signal, the phase detection circuit issues the signal VPHASE for shifting the phase of VRCLK.

The frequency adjust signal VFREQ is produced at the output of the frequency comparing circuit 210 in response to the signals VREF and VRCLK. The respective frequencies of VREF and VRCLK are computed and compared for producing VFREQ which corresponds to the difference in their respective frequencies. VFREQ also reveals which of the signals has the higher frequency. For example, if VRCLK has a higher frequency than VREF then VFREQ signals the programming logic circuit 205 to add delay to the programmable ring oscillator circuit 203, thereby slowing it down and bringing the VREF and VRCLK frequencies into equalization.

Various embodiments are known for computing the frequencies of two signals and finding the difference in their respective frequencies. In one embodiment the frequency comparing circuit 210 is comprised of a first counter circuit 202, a second counter circuit 204 and a subtraction circuit 206. The first counter circuit 202 counts the number of VREF signals over a predetermined period of time and produces a signal VCOUNT1 which corresponds to the number of VREF signals counted. The predetermined period of time is determined by the precision needed for resolving the delay in the programmable ring oscillator circuit 203. For example, if ten thousand VREF signals are counted in the predetermined period of time, the period of VRCLK can be resolved to within 1 picosecond of the period the incoming data signal.

A second counter circuit 204 counts the VRCLK signals for the same predetermined period of time and produces a signal VCOUNT2 which represents the result of the VRCLK count. The difference between VCOUNT1 and VCOUNT2 is computed in a subtraction circuit 206 to produce the output signal VFREQ. The VREF and VRCLK frequencies are continuously monitored in order to keep them equal. However, over time there can be minor fluctuations in the difference information provided in VFREQ as the predetermined period of time commences at different points in the VREF cycle. These minor fluctuations generally do not affect the time to synchronize VRCLK to the data signals and so are ignored. Once the VRCLK signal reaches a stable frequency, constant frequency adjustments are generally not needed because minor shifts are adjusted with VPHASE. If the frequency of VRCLK drifts too far away from that of VREF, the signal VFREQ causes a frequency adjustment in VRCLK. In order to minimize conflicting information being provided by VFREQ and VPHASE frequency adjustments are not made unless the frequency difference between VREF and VRCLK exceeds a threshold amount.

Conventional circuits such as phase locked loops, which are used for aligning the frequencies of two signals, rely on maintaining a constant phase between the signals in order to equalize the frequencies. Such circuits commonly multiply the signals in a phase detector to produce a phase control signal which is used to align the frequencies. The relative phases and frequencies of the signals are therefore fixed, which makes these circuits inadequate for synchronizing to data signals in a fibre channel receiver. Instead of multiplying signals to equalize their frequencies, the respective frequencies are calculated over a time period and then subtracted to produce the control signal. Frequency adjustments are thereby made independent of phase adjustments. It should be appreciated that other methods and circuits for computing the frequency of a signal may be known or occur to one skilled in the art.

Figure 3:
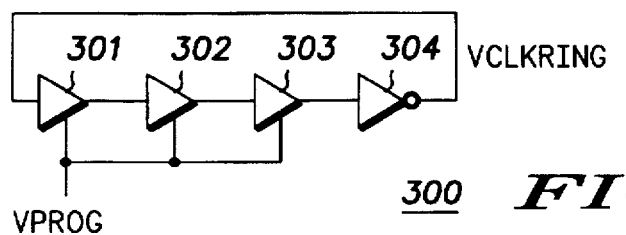
FIG. 3 is a block diagram of a programmable ring oscillator circuit.

FIG. 3 is a block diagram of a programmable ring oscillator circuit 300 comprising three serially connected programmable delay stages 301 through 303 and an inverting stage 304. The programmable delay stages 301 through 303 are generally identical, although they need not be. A typical programmable delay stage 301 has an input for receiving the programming signal VPROG and contains an array of delay elements which are enabled or disabled according to programming signal VPROG. The delay elements provide a capacitive load on the programmable delay stage 301 for producing the programmable propagation delay.

In the embodiment shown in FIG. 3 the programmable delay stages 301 through 303 are non-inverting so that the inverting stage 304 is needed to provide negative feedback for the programmable ring oscillator circuit 300 to prevent it from latching up. The inverting stage 304 can, but need not, be programmable. Inverting stage 304 also serves as an output buffer for producing the clock signal VRCLK. The number of programmable delay stages is chosen such that when the programming signal VPROG is in the middle of its programming range the clock signal VRCLK provides clock pulses at the specified 106.25 megahertz frequency of VREF.

Figure 4:
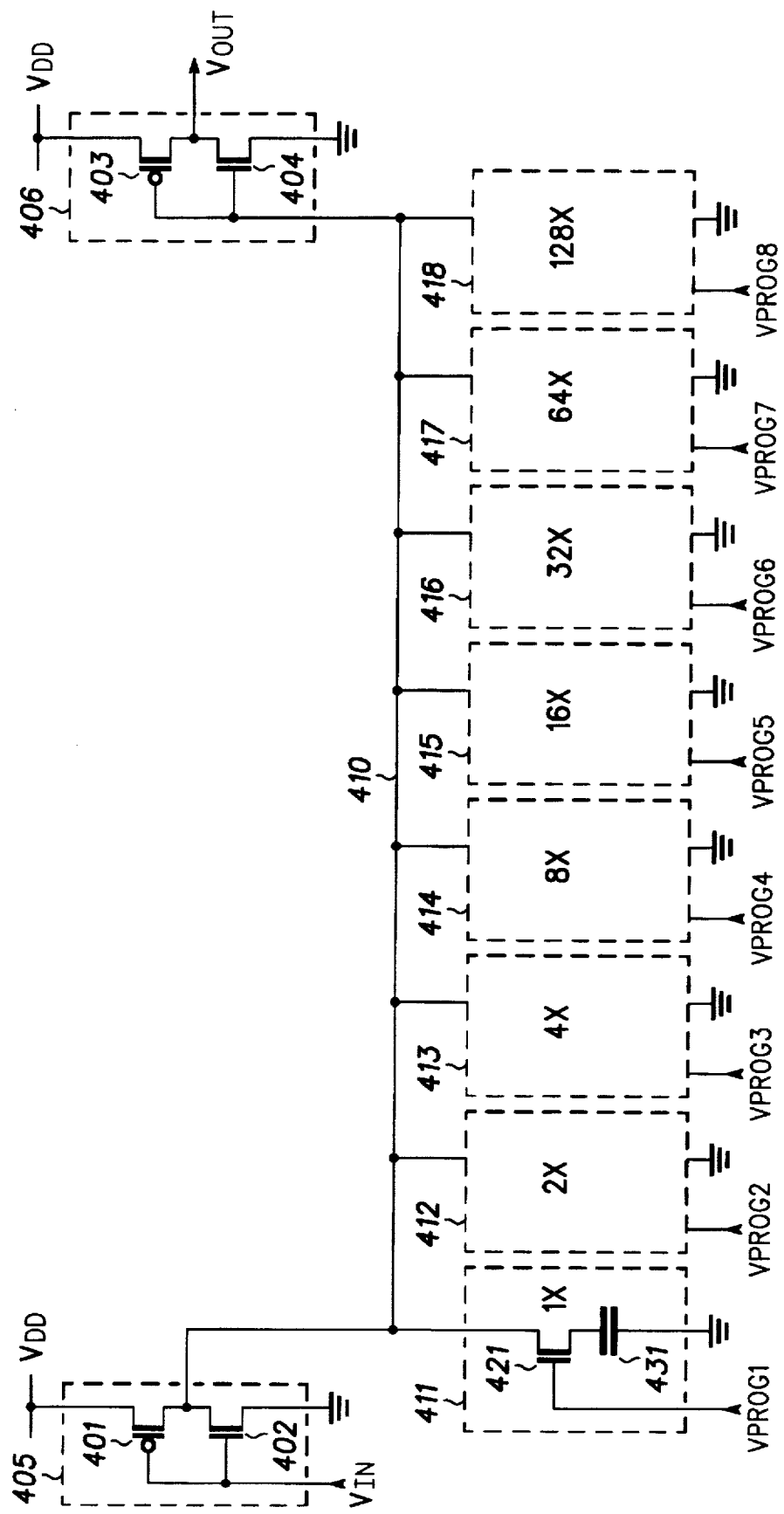
FIG. 4 is a schematic diagram of a programmable delay stage of a programmable ring oscillator circuit.

FIG. 4 is a schematic diagram of a programmable delay stage 400 which comprises one stage of a serially connected programmable ring oscillator circuit. The programmable delay stage 400 has inputs for receiving programming signals VPROG1 through VPROG8, which aggregate to comprise the programming signal VPROG. Other embodiments can have a different number of inputs for receiving a different number of programming signals. Transistors 401 and 402 form an input inverter 405 which has an input connected to the gate electrodes of the transistors 401 and 402 for receiving a signal VIN from an output of the previous stage of the programmable ring oscillator circuit. Input inverter 405 has an output at a load terminal 410 which is connected to the input of an output inverter 406.

Output inverter 406 is comprised of transistors 403 and 404, whose respective drain electrodes are connected for producing an output signal VOUT. Output inverter 406 is used for providing gain so that VOUT has faster transition edges than the slower transition edges on load terminal 410. The source electrodes of transistors 401 and 403 are connected to a first power supply potential such as VDD and the source electrodes of transistors 402 and 404 are connected to a second power supply potential such as ground potential.

An array of delay elements 411 through 418 are connected to load terminal 410 and a power supply terminal such as ground. Although the embodiment shown has eight delay elements, other numbers are possible depending on the requirements of the particular application. The programmable delay elements 411 through 418 are commonly binary weighted, as shown, but they can be equally weighted or can be weighted in some other proportion. Typical delay element 411 is comprised of a capacitor 431 connected in series with a transistor switch 421. Transistor switch 421 connects the capacitor 431 to, or disconnects it from, load terminal 410 according to the logic state of its respective programming signal VPROG1 through VPROG8. The programmable delay elements 411 through 418 present a capacitive load to load terminal 410 for providing programmable propagation delay to the output signal VOUT.

From the perspective of the programmable delay stage 400, the signals VFREQ and VPHASE, from which the signal VPROG is derived, have similar effects in the sense that they each cause a capacitive load to be switched in or out of the stage, thereby increasing or decreasing the propagation delay. One difference in the action of the two signals is that the signal VPHASE causes a temporary change in propagation delay, i.e., it affects one VRCLK transition and is then removed before the end of one VRCLK period. Thus, it causes the phase of VRCLK to be shifted but leaves the frequency otherwise unaffected. In contrast, the adjustment caused by signal VFREQ has a longer term effect, continuing until VFREQ itself changes due to an occurrence such as a frequency or temperature drift, a line disconnect or a power failure.

It should be appreciated that conventional methods which rely on multiplying two signals to equalize their frequencies have the disadvantage of fixing the phase relationship between the signals. They are therefore not adequate for synchronizing to a data stream in fibre channel networks. However, a method for equalizing the frequencies of a reference signal and a programmable clock signal which relies on computing their respective frequencies and then subtracting to provide the frequency adjustment allows a variable phase relationship between the signals. The independently variable phase is used for synchronizing a receiving clock signal to the phase of transmitted data signals.

While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

We claim:

1. A programmable clock circuit having an output for producing a clock signal at a frequency of a reference signal wherein a phase of the clock signal is variable in relation to a phase of the reference signal, comprising:

a frequency comparing circuit having a first input responsive to the clock signal, a second input responsive to the reference signal, and an output for producing a frequency programming signal, wherein the frequency programming signal corresponds to a frequency difference between the clock and reference signals;

a programmable ring oscillator circuit having an output coupled to the output of the programmable clock circuit and an input responsive to the frequency programming signal, wherein the frequency of the clock signal is adjusted in response to the frequency programming signal such that the frequency of the clock signal is equal to the frequency of the reference signal.

2. The programmable clock circuit of claim 1, the clock signal comprising a plurality of clock pulses and the reference signal comprising a plurality of reference pulses, wherein the frequency comparing circuit comprises:

a first counter circuit for counting the plurality of reference pulses over a predetermined period of time, the first counter circuit having an input coupled for receiving the reference signal and an output for producing a reference count signal corresponding to the frequency of the reference signal;

a second counter circuit for counting the plurality of clock pulses over the predetermined period of time, the second counter circuit having an input coupled for receiving the clock signal and an output for producing a clock count signal corresponding to the frequency of the clock signal; and a subtracting circuit having a first input responsive to the reference count signal, a second input responsive to the clock count signal and an output for producing the frequency programming signal.

3. The programmable clock circuit of claim 1 wherein the programmable ring oscillator circuit includes a plurality of programmable delay stages, the plurality of programmable delay stages being serially coupled to form a ring for oscillating and one of the plurality of programmable delay stages having an output coupled to the output of the programmable ring oscillator circuit.

4. The programmable clock circuit of claim 3 wherein each one of the plurality of programmable delay stages has a load terminal and an input responsive to the frequency programming signal, said each one of the plurality of programmable delay stages comprising:

a plurality of programmable delay elements, each one of the plurality of programmable delay elements having an input coupled for receiving the frequency programming signal and an output coupled to the load terminal for producing a delay corresponding to the frequency programming signal for adjusting the frequency of the clock signal.

5. The programmable clock circuit of claim 4, further comprising:

a means for detecting a phase difference between the clock signal and a data signal, said means having a first input for receiving the data signal, a second input for receiving the clock signal and an output for producing a phase programming signal for varying the phase of the clock signal, wherein the delay produced on the load terminal of each one of the plurality of programmable delay elements further corresponds to the phase programming signal.

6. A clock circuit, comprising:

a ring oscillator circuit having an output for providing a clock signal of the clock circuit and a control input coupled for receiving a programming signal to adjust a delay of the ring oscillator circuit for modifying a clock frequency of the clock signal; and a frequency comparing circuit having a first input coupled to the output of the ring oscillator circuit, a second input coupled for receiving a reference signal operating at a reference frequency, and an output for producing the programming signal, where the programming signal is indicative of a difference between the clock frequency and the reference frequency.

7. The clock circuit of claim 6, further comprising:

a phase detector having a first input coupled for receiving the clock signal, a second input coupled for receiving the reference signal, and an output for providing a phase programming signal indicative of a phase difference between a the clock signal and the reference signal; and a programming circuit having a first input responsive to the phase programming signal, a second input coupled to the output of the frequency comparing circuit for receiving a frequency programming signal, and an output for providing the programming signal.

8. The clock circuit of claim 7, wherein the frequency comparing circuit includes:

a first counter circuit for counting pulses of the reference signal over a predetermined period of time to produce a reference count at an output;

a second counter circuit for counting pulses of the clock signal over the predetermined period of time to produce a clock count at an output; and a subtracting circuit having first and second inputs respectively coupled to the outputs of the first and second counter circuits, and an output for producing the frequency programming signal.

9. The clock circuit of claim 6, wherein the ring oscillator circuit includes a programmable capacitor having a control electrode coupled to the control input of the ring oscillator input for adjusting a capacitance with the programming signal.

10. A method of synchronizing a first signal to a second signal, comprising the steps of:

comparing a frequency of the first signal to a frequency of the second signal to produce a frequency programming signal; and programming a delay of a ring oscillator circuit with the frequency programming signal to adjust the frequency of the first signal to equal the frequency of the second signal.

11. The method of claim 10, wherein the step of comparing includes the steps of:

counting pulses of the first signal over a predetermined period of time to produce a first count;

counting pulses of the second signal over the predetermined period of time to produce a second count; and subtracting the first count from the second count to produce the frequency programming signal.

12. The method of claim 10, wherein the step of programming includes the step of varying a capacitance of the ring oscillator circuit with the frequency programming signal to modify the delay of the ring oscillator circuit.

13. The method of claim 12, wherein the step of varying includes the step of switching a programmable capacitance in the ring oscillator circuit with the frequency programming signal to modify the delay.

14. The method of claim 12, further comprising the steps of:

detecting a phase difference between the first and second signals to produce a phase programming signal; and adjusting the capacitance of the ring oscillator circuit with the phase programming signal to modify a phase of the first signal.

15. The method of claim 14, wherein the phase programming signal has a duration of one pulse of the first signal and the frequency programming signal has a duration of at least two pulses of the first signal.

* * * * *